United States Patent
Haines

(10) Patent No.: US 7,494,749 B2
(45) Date of Patent: Feb. 24, 2009

(54) PHOTOLITHOGRAPHY USING INTERDEPENDENT BINARY MASKS

(75) Inventor: Jeffrey C. Haines, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 11/064,431

(22) Filed: Feb. 22, 2005

(65) Prior Publication Data

US 2005/0147898 A1  Jul. 7, 2005

Related U.S. Application Data

(63) Continuation of application No. 09/497,942, filed on Feb. 4, 2000, now abandoned.

(51) Int. Cl.
 *G03F 9/00* (2006.01)
(52) U.S. Cl. .............. 430/5; 430/313; 430/323; 430/329; 430/330; 430/394
(58) Field of Classification Search ............ 430/5, 430/311, 312, 394, 313, 329, 323, 330
 See application file for complete search history.

(56) References Cited

U.S. PATENT DOCUMENTS

| | | | | |
|---|---|---|---|---|
| 5,424,154 A | * | 6/1995 | Borodovsky | 430/5 |
| 5,451,488 A | * | 9/1995 | Fukuba | 430/312 |
| 5,532,090 A | * | 7/1996 | Borodovsky | 430/5 |
| 5,702,848 A | | 12/1997 | Spence | 430/5 |
| 5,753,417 A | * | 5/1998 | Ulrich | 430/312 |
| 5,766,806 A | | 6/1998 | Spence | 430/5 |

OTHER PUBLICATIONS

Liegl et al., "Lithography Process Cost Considerations for 130 nm Groundrules," *Arch Microlithography Symposium* (Arch Chemicals, Inc. Interface '99), pp. 217-223 (Nov. 14-16, 1999).

* cited by examiner

*Primary Examiner*—John S Chu
(74) *Attorney, Agent, or Firm*—Williams, Morgan & Amerson, P.C.

(57) ABSTRACT

The invention, in its various aspects, is an interdependent binary photomask for use in a photolithography operation in a semiconductor fabrication process, a method for fabricating these interdependent photomasks, and a method of using the same. The photomask comprises a first binary reticle and a second binary reticle. Each binary reticle includes a pattern formed on a plate, but the pattern formed on one plate is interdependent with the pattern formed on the other plate so that the reticles are used in tandem to transfer the pattern onto wafers having features residing in different focal planes. The method of fabricating the interdependent binary photomask consequently includes specifying a first and a second portion of a circuit layout, the first and second circuit portions being interdependent. The first and second portions are digitized and used to form first and second interdependent patterns on separate reticles. In use, the first reticle is aligned with a portion of a wafer and the wafer portion is then exposed. The second reticle is then aligned with the same wafer portion and the wafer portion exposed.

9 Claims, 7 Drawing Sheets

PHOTOLITHOGRAPHY USING INTERDEPENDENT BINARY MASKS

CROSS-REFERENCE TO RELATED APPLICATION

This is a continuation of application Ser. No. 09/497,942 filed on Feb. 4, 2000 now abandoned.

BACKGROUND OF THE INVENTION

1. Field of the Invention

The present invention pertains to photolithography in a semiconductor fabrication process and, more particularly, to the use of an interdependent binary photomask including multiple, interdependent binary masks during exposure in a photolithography operation.

2. Description of the Related Art

Semiconductor devices, or microchips, are manufactured from wafers of a substrate material. Layers of materials are added, removed, and/or treated during fabrication to create the integrated, electrical circuits that make up the device. The fabrication essentially comprises four operations:

layering, or adding thin layers of various materials to a wafer from which a semiconductor is produced;

patterning, or removing selected portions of added layers;

doping, or placing specific amounts of dopants in the wafer surface through openings in the added layers; and heat treatment, or heating and cooling the materials to produce desired effects in the processed wafer.

Although there are only four basic operations, they can be combined in hundreds of different ways, depending upon the particular fabrication process. See, e.g., Peter Van Zant, *Microchip Fabrication A Practical Guide to Semiconductor Processing* (3d Ed. 1997 McGraw-Hill Companies, Inc.) (ISBN 0-07-067250-4). The fabrication process generally involves processing a number of wafers through a series of fabrication tools. Each fabrication tool performs one or more of the four basic operations. The four basic operations are performed in accordance with an overall process to finally produce wafers from which the semiconductor devices are obtained.

Of these four operations, many in the art consider patterning to be the most critical. Patterning is known to those in the art by many names. Other names for patterning include photolithography, photomasking, masking, oxide removal, metal removal, and microlithography. The term "photolithography" will hereafter be used to refer to patterning operations. Photolithography typically involves a machine called an "exposure tool," or sometimes also called a "stepper" or a "scanner". An exposure tool positions a portion of a wafer being processed under a "photomask." The photomask is usually a "reticle," which is a copy of a pattern created in a layer of chrome on a glass plate. Light is then transmitted through the reticle onto a thin layer of material called "photoresist" previously added to the wafer. The chrome blocks the light while the glass allows it to pass.

The light shining through the pattern on the reticle creates an "aerial image" which, when interfacing with the photoresist at the optimum focal plane, changes the material characteristics of the photoresist where it shines. In essence, this allows the pattern on the reticle to be duplicated in, or transferred to, the photoresist. The change in material characteristics makes the photoresist susceptible to removal in the subsequent develop operation prior to the next sequential process step such as etching or ion implantation. The exposure tool then positions another portion of the wafer under the reticle, and the pattern transfer is repeated. The process is repeated until the entire wafer has completed the pattern transfer operation. This process of shining light through a photomask to treat a photoresist is known as "exposure," or "pattern transfer."

The reticle in the example above is more precisely known as a "binary mask" because each portion of the reticle either transmits all the light or blocks all the light. However, ever-decreasing feature sizes have created problems for binary masks. The light shining through the chrome pattern scatters at the edges of the chrome traces, with undesirable effects on the pattern transfer process to the photoresist. The smaller the feature sizes, the more acute the problem. Another problem has to do with a technological limitation known as "depth of focus" ("DOF"), which is also related to the wavelength of light utilized.

Technically, depth of focus describes the ability of an optical system to crisply resolve images in two different focal planes simultaneously. This technological limitation is most commonly encountered in photography. A photographer typically focuses a camera on a subject set against a background. The subject is in a focal plane closer to the camera and the background is in a different focal plane further from the camera. If there is a sufficiently small distance between the subject, i.e., the closer focal plane, and the background, i.e., the further focal plane, the background will be in focus in the resulting photograph. This "sufficient distance" is called the "depth of focus." Thus, if the second plane is within the first plane's depth of focus, both focal planes may be imaged with a minimal loss of resolution. As the distance of the second plane becomes further from the first, resolution will become poorer until it "blurs," or becomes out of focus in the photograph.

The photolithography operation is subject to this same limitation. In fact, the depth of focus problem more acutely affects photolithography operations than they do photography because the surface of a wafer typically has many focal planes. The topography of a wafer under fabrication is extremely rugged relative to the wavelength of light utilized in the pattern transfer process. At any given point in the operation, there typically are structures built up and trenches dug into the wafer's surface. The depth of focus limitation is a function of the wavelength of the light employed in the optical system. Photolithography processes employ light having very short wavelengths in order to achieve sufficient resolution of the small features being fabricated on semiconductor wafers. Short wavelengths give a small depth of focus, and as wavelengths become increasingly smaller, so does the DOF. Thus, the distance between the top plane and bottom plane, i.e., the top surface and the bottom of the trenches in the wafer, or even the distance between the top and bottom surfaces of the photoresist, can be sufficiently great as to cause depth of focus problems.

The surface topography combined with the resist thickness frequently dictate that the optimal focal plane for a given feature be very different from a focal plane for another. For example, in some circumstances it may be desirable to focus on the topmost plane whereas in some circumstances it may be desirable to focus on the bottommost plane. Since the wafer is given only a single pass exposure, a focal plane between the top and bottom planes is typically chosen.

Historically, the depth of focus for each of the top and bottom planes is typically deep enough so that they provide an overlap wherein such an intermediate plane can be located. This intermediate focal plane, being inside the depth of focus for both the top and bottom planes, can still provide sufficient resolution. However, in today's advanced applications, the amount of overlap is typically so small that it is difficult or even impossible to locate and maintain the intermediate focal plane consistently enough to provide high yields in a commercial production environment.

One approach to the problem performs the entire photolithography operation twice, using two different binary masks for two different focal planes in two different exposure passes. However, the pattern transfer operation previously discussed is part of a much larger photolithography process. The wafers, once exposed, are then developed, baked, and sent to the next stage in the process flow for either etch or ion implantation. In embodiments where the wafers are exposed twice using different binary masks, the wafers have to be developed, baked, and then subsequently processed after each exposure. However, this "repeated photolithography" approach cannot be used for a number of applications where the features of interest of necessity must be processed simultaneously through subsequent operations.

Another approach to this problem employs what is known as "phase shift" photomasks. There are a variety of phase shift photomask types. But all shift the phase of the light waves so that, when the light scatters, it does not interfere with itself to reduce accuracy and resolution of the pattern in the photoresist. An attenuated phase shift photomask, for instance, comprises a reticle that attenuates the light wave so that only a portion of it transmits through the plate to the wafer. Since no portion transmits all of the impinging light, this type of mask is not "binary." A complementary phase shift photomask actually comprises two reticles, where, at most, only one of which can be binary. The first is used to expose the photoresist and imprint the pattern in a first pass and the second is used to sharpen the pattern in a second pass. Both passes are performed before the wafer is stepped to process another portion of the wafer so that the wafers are not exposed, developed, baked, and etched twice. However, while this approach effectively provides a small increase in DOF, it is not appropriate for many applications in which this incremental increase is insufficient to cause the focal planes of different feature to overlap.

The present invention is directed to resolving one or all of the problems mentioned above.

SUMMARY OF THE INVENTION

The invention, in its various aspects, is an interdependent binary photomask for use in a photolithography operation in a semiconductor fabrication process, a method for fabricating these interdependent photomasks, and a method of using the same. The photomask comprises a first binary reticle and a second binary reticle. Each binary reticle includes a pattern formed on a plate, but the pattern formed on one plate is interdependent with the pattern formed on the other plate so that the reticles are used in tandem to transfer the pattern onto wafers having features which require a customized aerial image due to factors such as, but not limited to, differing focal planes, pattern densities, and exposure dosage. The method of fabricating the interdependent binary photomask consequently includes specifying a first and a second portion of a circuit layout, the first and second circuit portions being interdependent. The first and second portions are digitized and used to form first and second interdependent patterns on separate reticles. In use, the first reticle is aligned with a portion of a wafer and the wafer portion is then exposed. The second reticle is then aligned with the same wafer portion and the wafer portion exposed.

BRIEF DESCRIPTION OF THE DRAWINGS

The invention may be understood by reference to the following description taken in conjunction with the accompanying drawings, in which like reference numerals identify like elements, and in which.

Figures 1A, 1B:
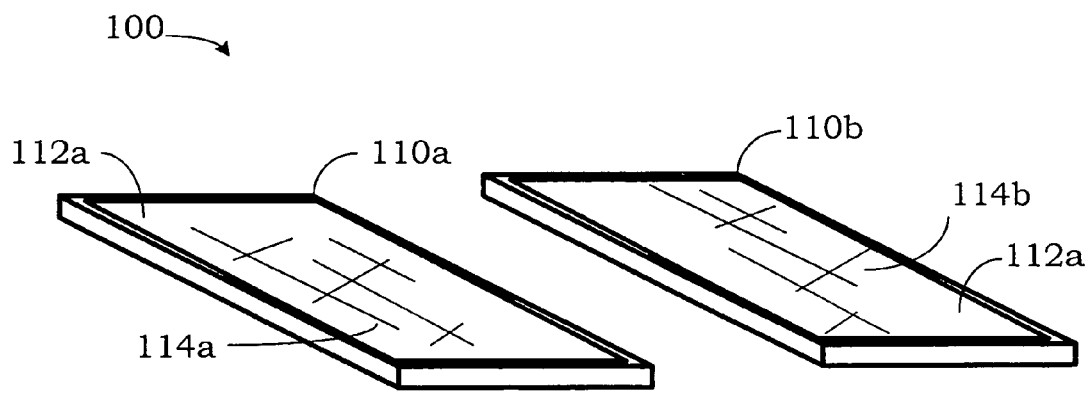
FIGS. 1A-B illustrate a dual, binary photomask for use in a photolithography operation in a semiconductor fabrication process in accordance with the present invention.
Figure 4D:
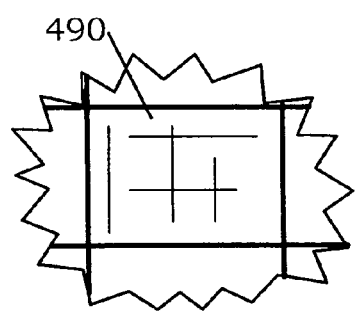
FIGS. 4A-4D illustrate one particular embodiment of the methods in FIG. 2 and FIG. 3 by which dual, binary photomasks may be constructed and employed in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

FIGS. 1A-B illustrate a dual, binary photomask 100 for use in a photolithography operation in a semiconductor fabrication process. The photomask 100 comprises a first binary reticle 110a including a plate 112a coated with a first pattern 114a and a second binary reticle 110b including a plate 112b coated with a second pattern 114b. The second pattern 114b is interdependent with the first pattern 114a so that, in conjunction, they constitute the entire pattern to be etched onto a wafer. The term "interdependent," as used herein, means that the two patterns on the different reticles define, in conjunction, the complete pattern to be transferred to a wafer. The first pattern 114a corresponds to those portions of the pattern to be transferred at a first focal plane. The second pattern 114b corresponds to those portions of the pattern to be transferred at a second focal plane. The first and second patterns 114a-b may be created for use with either polymerizing, or negatively acting, photoresists or photosolubilizing, or positively acting, photoresists. Note that, in some embodiments, the first and second patterns 114a-b may correspond to portions of the pattern to be transferred having different pattern densities or exposure dosages rather than different focal planes.

More particularly, the reticles 110a-b may be constructed from conventional materials. The glass plates 112a-b, for instance, may be either borosilicate glass or quartz. These materials are selected for their fine dimensional stability and transmission properties of light at the wavelengths used in photolithography. The patterns 114a-b may be chrome, chromium, chromium oxide, or chromium nitride. Most embodiments, however, will probably employ chrome deposited in layers of approximately 1,000 Å. Nevertheless, as will be recognized by those in the art having the benefit of this disclosure, the particular materials employed in any given embodiment will be implementation specific. The first and second patterns 114a-b may be either 1:1 with the pattern to be laid or may be enlarged for use in a reduction exposure tool. Commonly employed, enlarged ratios may include 4:1, 5:1 and 10:1.

Figure 2:
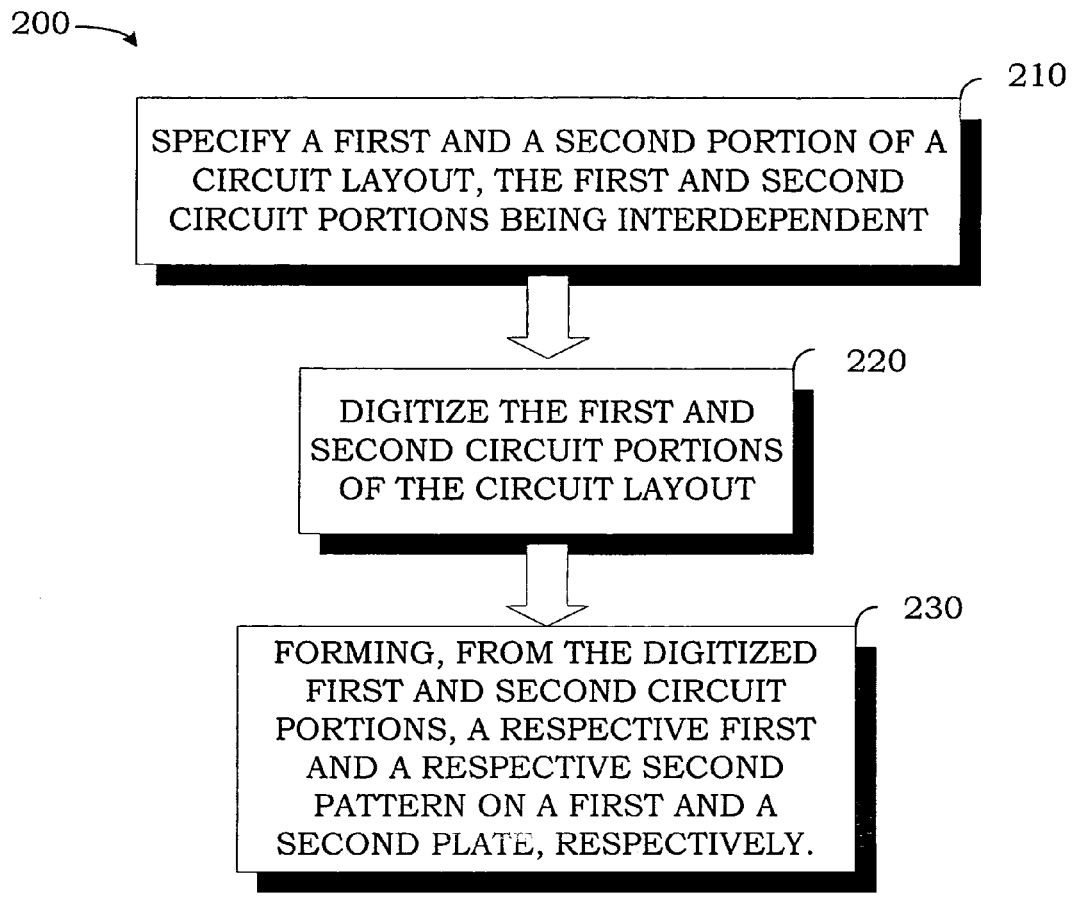
FIG. 2 illustrates one method by which the interdependent masks may be constructed in accordance with another aspect of the present invention.

FIG. 2 illustrates one method 200 by which the interdependent masks may be constructed in accordance with another aspect of the present invention. The method begins by specifying a first and a second portion of a circuit layout, the first and second circuit portions being interdependent, as set forth in the box 210. This specification may be modeled along the lines of specifying conventional patterns for reticles, but the first and second patterns are interdependent. This will require some modification to design rules and design rule checkers used in this process. However, such modifications will become apparent to those in the art having the benefit of this disclosure upon reading the same. Once the first and second portions are specified, they are then digitized, as set forth in the box 220. The actual digitization may be conducted in accordance with conventional practice. The digitized first and second portions are then formed on respective first and plates, as set forth in the box 230. This formation can also be performed in accordance with conventional practice. One particular embodiment of this method 200 is discussed more fully below with reference to FIGS. 4A-4C.

Figure 3:
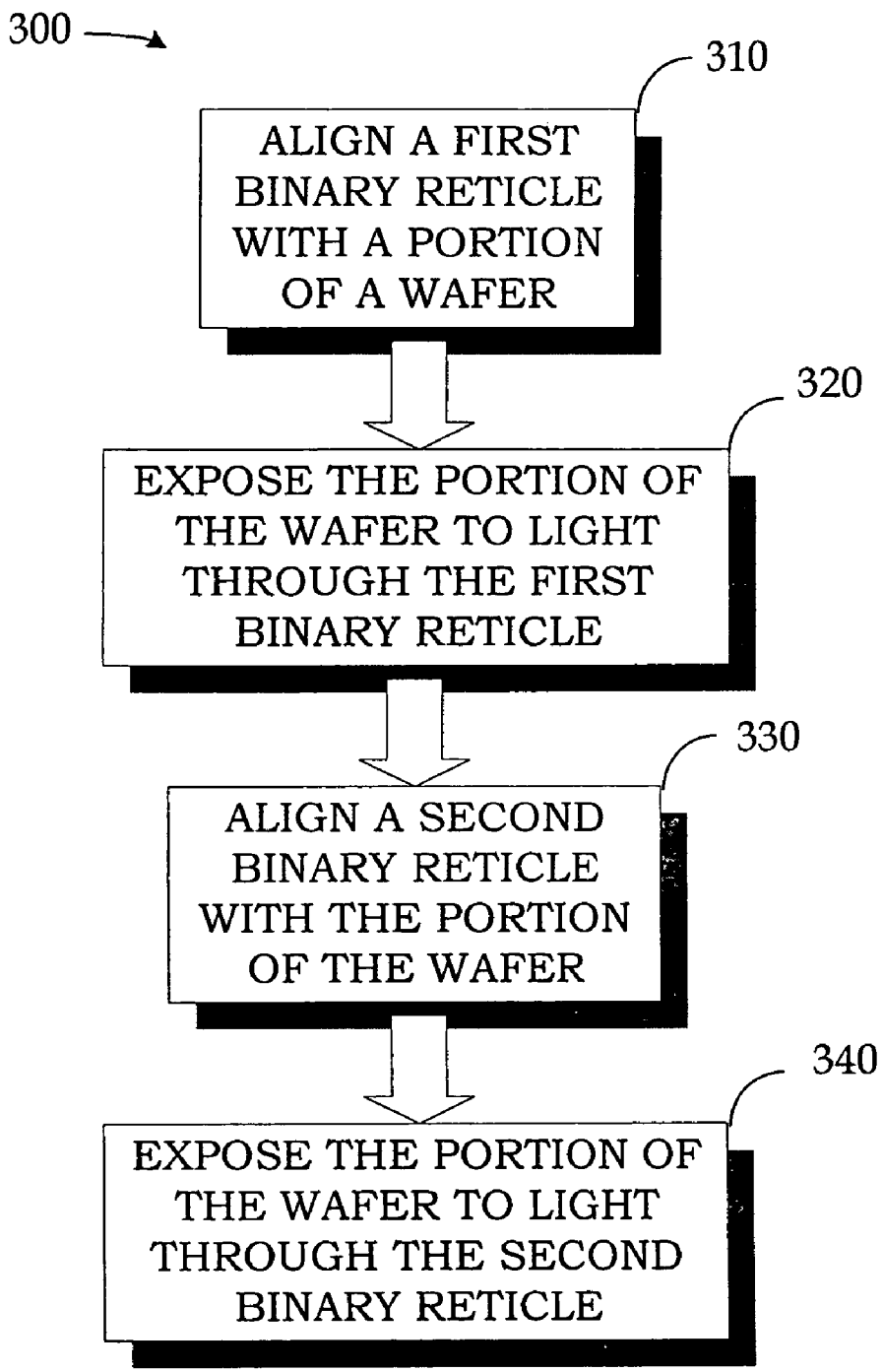
FIG. 3 illustrates one embodiment of a method for using the interdependent photomask of FIGS. 1A-B constructed by the method in FIG. 2 in accordance with a third aspect of the invention.

FIG. 3 illustrates one embodiment of a method 300 for using the interdependent photomask of FIGS. 1A-B constructed by the method 200 in FIG. 2 in accordance with a third aspect of the invention. More particularly, the method 300 is a method for aligning interdependent mask and exposing a wafer. In this particular embodiment, the method 300 is performed using the interdependent mask of FIG. 1. At the time of alignment, i.e., when the method 300 begins, the wafer has already been coated with a photoresist.

The method 300 begins with alignment, as set forth in the box 310. Alignment may be performed using any suitable technique known to the art. Typically, alignment is performed using a structure known as an "alignment mark". The alignment mark includes an alignment target that is formed in a layer of the wafer. An alignment guide formed within the mask plate is then visually or optically aligned with the alignment mark. Alignment is achieved by moving the mask plate until the alignment guide and the alignment target are correctly positioned with respect to each other. However, other techniques may be also be used.

Figure 4A:
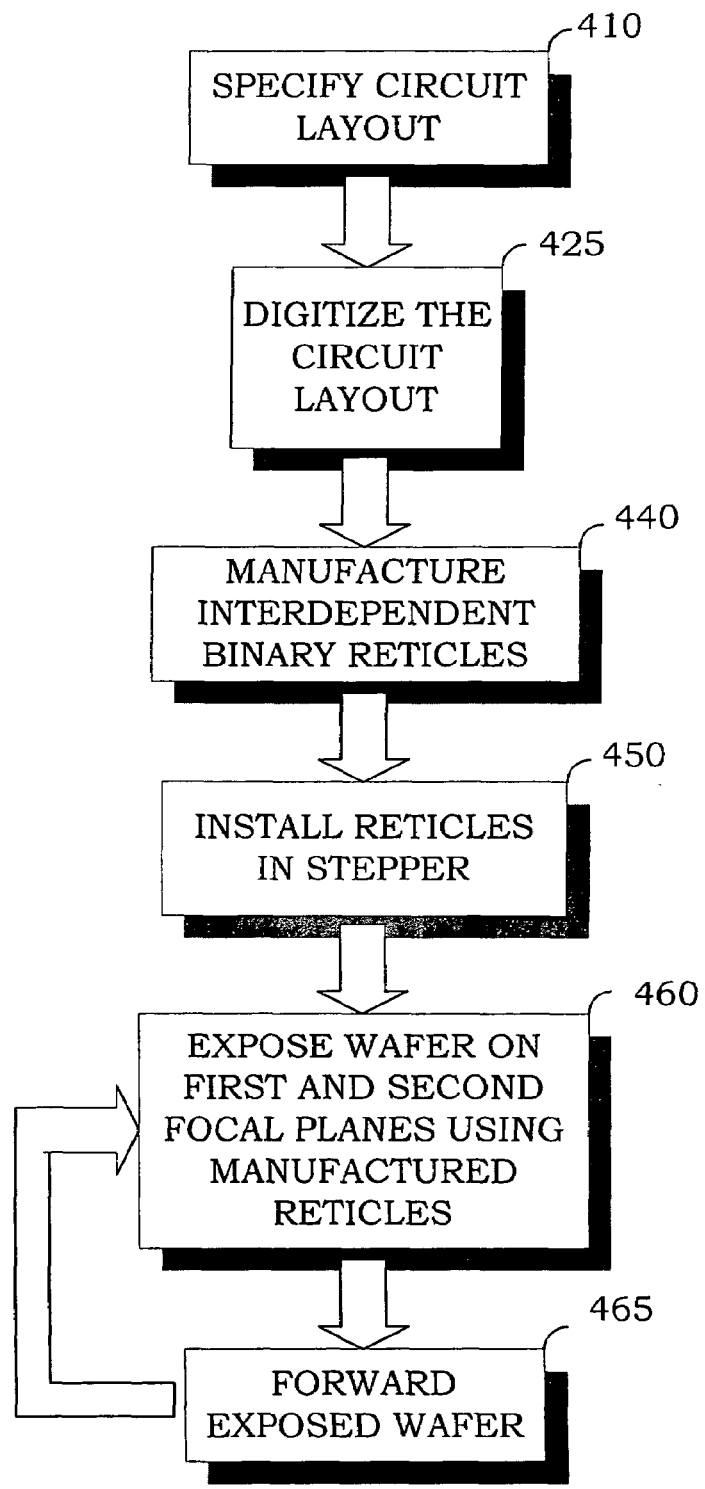
Figure 4B:
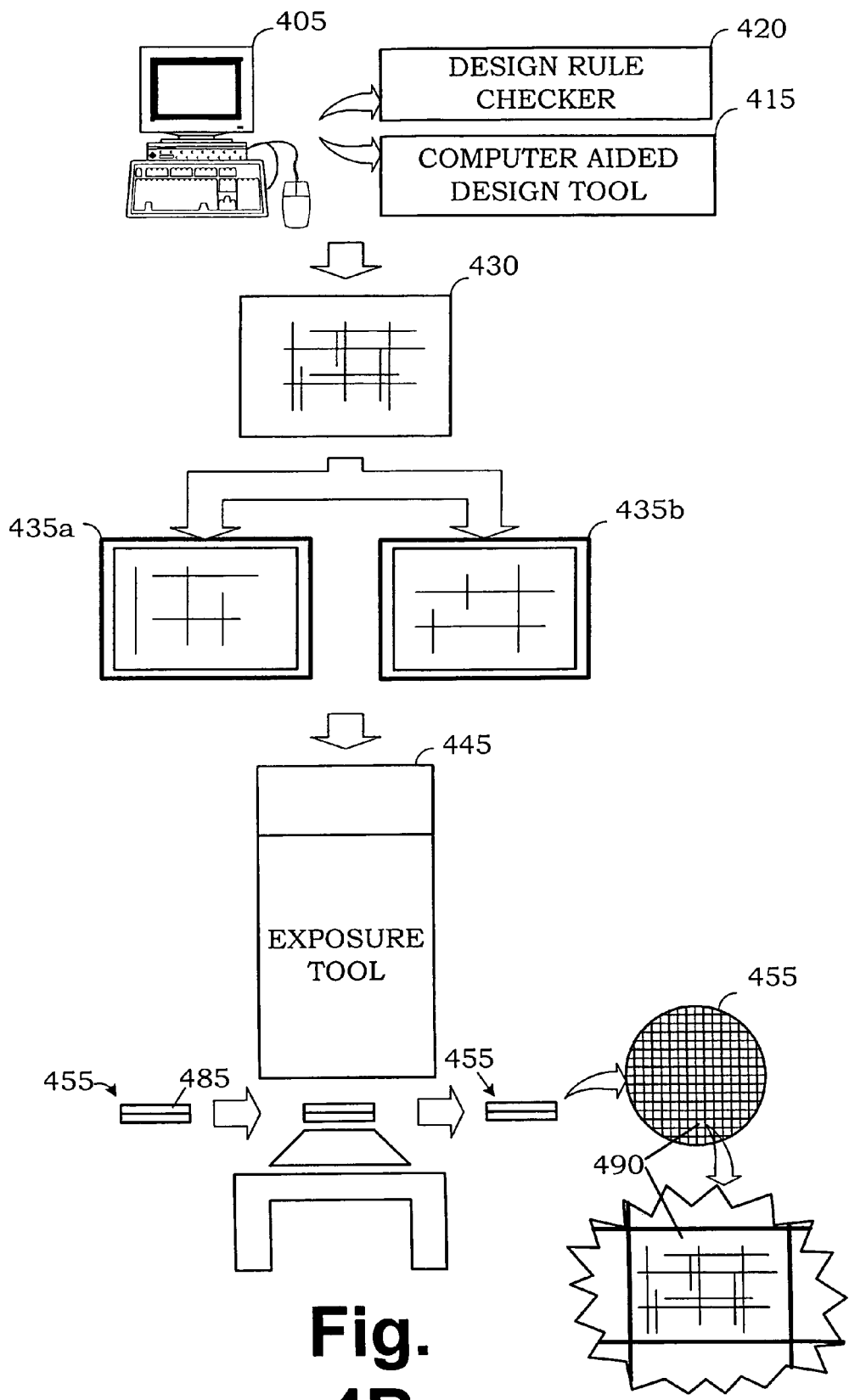

FIGS. 4A-4D illustrate one particular process by which dual, binary photomasks may be constructed and employed in accordance with the present invention. More particularly, FIG. 4A illustrates a process 400 and FIG. 4B conceptually depicts certain portions of the process 400. The process for making and using binary masks has been highly computerized and is somewhat analogous to the wafer photolithography process. Turning now to FIG. 4B, the designer of complex integrated circuits specifies a circuit layout, or design, 430 on a computer 405 (shown in FIG. 4B) which requires compliance with certain predetermined design rules, as set forth in the box 410 in FIG. 4A. The computer 405 is encoded with a computer aided design tool 415, which includes the design rules, and a design rule checker 420 that validates the design.

When the functional circuit layout 430 is completed, the computer aided design tool 410 digitizes the circuit layout 430, as set forth in the box 425, by creating a digital bit map or vector file on a program storage medium, such as a PG Tape (not shown). In the present invention, there are actually two digital bit maps, one for each of the circuit layout portions to be patterned on the separate binary reticles. Thus, the digitization process includes software implemented routines for apportioning the circuit layout 430 across the two reticles 435a-b. Such a routine may, for instance, separate out those features of the circuit layout 430 within the depth of focus for a first focal plane from those within the depth of focus for a second focal plane. The separated groups of features are then digitized into separate bit maps. The bit maps are "interdependent," as that term is defined above, in that neither defines the entire circuit layout 430, but together do so. The digital bit maps represent the data in a standard and known data format for manufacturing the photomask to accomplish the design. These digital files control automatic processes for manufacturing the reticles 435a-b, as set forth in the box 440.

Figure 4C:
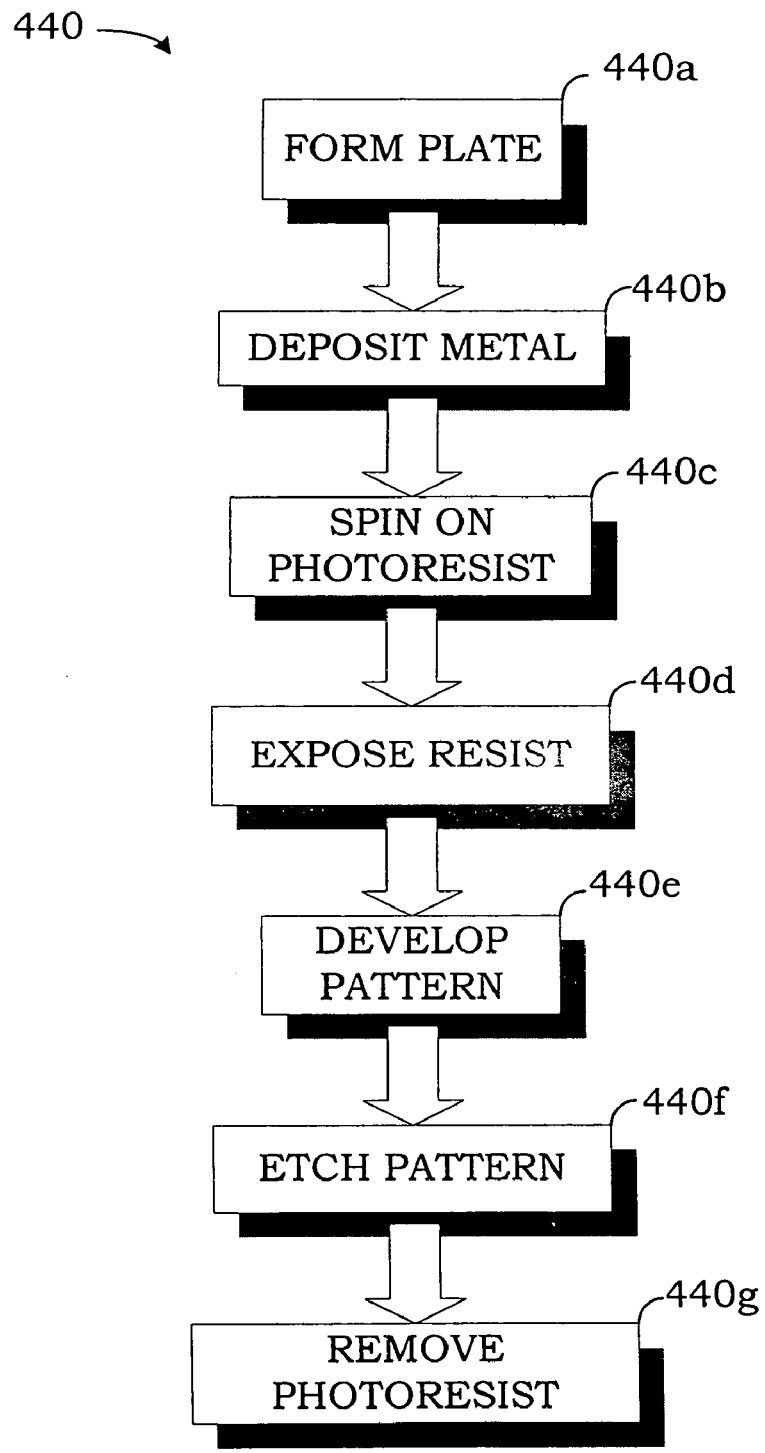

FIG. 4C illustrates an automatic process for manufacturing the reticles 435a-b, as set forth in the box 440 of FIG. 4A. The reticle manufacture begins with forming the plate (not shown), as set forth in the box 440a. The plate may be formed of either borosilicate glass or quartz. Next, a layer of metal, perhaps chrome, chromium, chromium oxide, or chromium nitride, is deposited on the plate, as set forth in box 440b. Typically, the metal will be deposited using a sputtering technique as is known in the art. As set forth in the box 440c, the photoresist is then spun-on top the deposited metal and exposed, as set forth in the box 440d. Exposure may be by laser or by e-beam direct write. The pattern in the exposed photoresist is then developed and etched, as set forth in the boxes 440e-f. Finally, as set forth in the box 440g, the unetched photoresist is removed.

Turning now to FIG. 4B, the reticles 435a-b are then installed in exposure tool such as a stepper or a scanner, 445, as set forth in the box 450. The exposure tool 445 is designed for use in standard photolithography operations. For instance, ASML Lithography Holding N.V., manufactures and sells an exposure tool with a reticle handler for use in a "repeated photolithography process" as was discussed above. Such an exposure tool may be reprogrammed to switch reticles at the end of each pass instead of each operation to implement the present invention. ASML Lithography Holding N.V. is located in the United States at 8555 South River Parkway, Tempe, Ariz. 85284, and may be contacted by phone at 480-383-4422, or by facsimile transmission at 480-383-3995. Alternatively, they may be contacted over the World Wide Web of the Internet at <http://www.asml.com>.

Returning, to FIG. 4B, the exposure tool 445 consequently includes a reticle handler (not shown) and exposes the wafer 455 using first the reticle 435a and then the reticle 435b to expose the wafer on two different focal planes, as set forth in the box 460. The exposure tool 445 automatically carries out the photolithographic exposure repeatedly on the wafer 455 by exposing the photoresist layer 485 each die 490 of the wafer 455 using the first reticle 435a. At this point, the portion of the pattern to be developed has been exposed onto the photoresist and the first focal plane, as is shown for one die 490 in FIG. 4D. The exposure tool 445 moves the wafer 455, i.e., stepping, and repeating the same exposures at an adjoining location. Eventually, each portion of the wafer 455 is exposed under the first reticle 435*a* in this manner.

Returning to FIG. 4B, the reticle handler of the exposure tool 445 then swaps out the first and second reticles 435*a-b*, and exposes each of the dies 490 using the second binary reticle 435*b*. The portion of the pattern to be developed has then been exposed onto the photoresist and the second focal plane. Because the patterns on the first and second reticles 435*a-b* are interdependent, the entire pattern to be developed has now been exposed, as shown for one die 490 in FIG. 4B. The exposure tool 445 moves the wafer 455, i.e., stepping, and repeating the same exposures at an adjoining location. Eventually, each portion of the wafer 455 is exposed under the second reticle 435*b* in this manner, and moves on to the next operation in the process flow, as set forth in the box 465. Thereafter, additional wafers 455 may be processed.

Thus, in the present embodiment, the exposure tool 445 exposes each die 490 on the wafer 455 using the first reticle 114*a*, switches the second reticle 114*b* for the first reticle 114*a*, then exposes each die 490 on the wafer 455 using the second reticle 114*b*. Furthermore, in this particular embodiment, the circuit layout 430 is apportioned across the reticles 114*a-b* according to the DOF for the features in the pattern to be transferred. However, the invention is not so limited. For instance, alternative embodiments might expose a first expose a die, or a group of dies 490 using the first reticle 114*a*, switch the reticles 114*a-b*, and then expose the group of dies 490 before stepping to a new group of dies 490. Alternative embodiments might also apportion the circuit layout 430 according to pattern densities or exposure dosages for different features rather than DOF requirements.

The reticles 435*a-b* may be used with or without pellicles (not shown), i.e., thin layers (≈0.80-2.5 µm) of optically neutral polymers stretched onto the frame of the reticles 435*a-b* at a height sufficient to remove them from their focal plane. Pellicles consequently help protect the reticles from dust contamination and scratches while not interfering otherwise interfering with the exposure. Exemplary polymers include, but are not limited to, nitrocellulose ("NC"), used with broadband exposure sources (≈340-460 nm), and cellulose acetate ("AC"), used with mid-ultraviolet exposure sources. If a pellicle is used, it may be coated with antireflective coating. For additional information on the fabrication of pellicles, see van Zandt, supra, at p 291.

Figure 5:
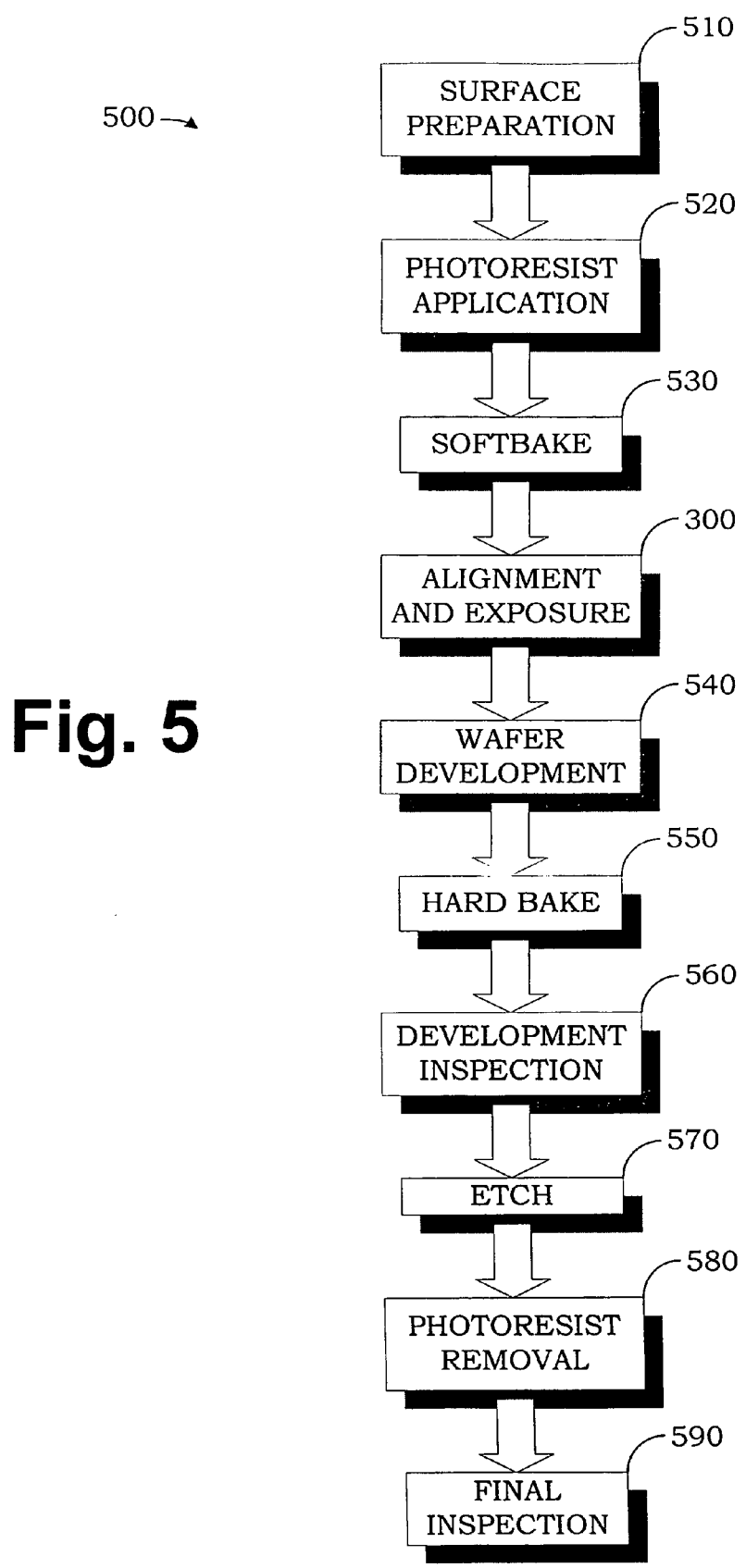
FIG. 5 illustrates a simplified 10-step photolithography process employing the present invention.

As will be appreciated by those in the art having the benefit of this disclosure, the method 300 in FIG. 3 will generally be implemented as part of a larger photolithography operation. FIG. 5 illustrates one embodiment of a method implementing a photolithography operation. The method 500 is a simplified, 10-step photolithography process and admits wide variation in particular implementations. The method 300 in FIG. 3 is here employed in the alignment and exposure portion of the method 500.

The method 500 begins with surface preparation, as set forth in the box 510. Surface preparation will typically involve particle removal, dehydration baking, and priming, each by any suitable technique known to the art. For instance, particle removal may be by high-pressure nitrogen blowoff, wet chemical cleaning, rotating brush scrubber, or high-pressure water stream. Similarly, priming may be by immersion priming, spin priming, or vapor priming.

Surface preparation is followed by photoresist application, as set forth in the box 520, which generally involves spin coating a thin layer of photoresist on the prepared surface of the wafer. Any one of the dynamic, moving-arm, manual, and automatic dispensing techniques may be used. The backside may also be coated, depending on the particular implementation.

The wafer with the applied photoresist is then soft baked, as set forth in the box 530. The soft bake heats the wafer and photoresist to evaporate portions of the photoresist's solvents. Depending on the particular implementation, convection ovens; manual hot plates; in-line, single-wafer hot plates; moving-belt hot plates; moving-belt infrared ovens; microwave ovens; or vacuum ovens may be used. After soft bake, the method 300 in FIG. 3 is employed to perform the alignment and exposure.

After the alignment and exposure in box 300, the method 500 continues with wafer development, as set forth in the box 540. As those in the art having the benefit of this disclosure will appreciate, this resist development is highly implementation specific. Implementation specific factors include whether the resist is positive or negative, the material of the resist, and the thickness of the resist. Any development technique known to the art and appropriate in light of these factors may be used. Exemplary development techniques include, but are not limited to, immersion, spray, puddle, plasma, and dry development techniques.

The wafers are then hard baked after development, as set forth in the box 550. Hard bake is similar to softbake and similar techniques may be employed. Thus, depending on the particular implementation, convection ovens; manual hot plates; in-line, single-wafer hot plates; moving-belt hot plates; moving-belt infrared ovens; microwave ovens; or vacuum ovens may be used. Operational parameters, such as time and temperature, vary depending on the technique employed. In one variation, the wafers are hard baked for 30 minutes at a temperature between 130-200° C. The lower temperature is generally set to so the resist image edge adheres well to the surface. The upper temperature is set by the flow point of the resist material.

Wafer development is followed by development inspection, as set forth in the box 560. The inspection identifies wafers having a low probability of passing final, masking inspection; provides process performance and process control data; and identifies wafers for rework. The inspection may be manual, automatic, or both.

After the development inspection in box 560, the pattern has been transferred to the wafer and the wafer is ready for subsequent processing, as set forth in the box 570. In this example, the next step is an etch process which removes the top layer of the wafer in areas exposed by holes in the pattern of the photoresist. The etch may be either "wet" or "dry" as are known in the art. However, in alternative embodiments, development inspection might be followed by some other operation, such as ion implantation.

The photoresist is then removed, or "stripped," from the wafer, as set forth in the box 580. Stripping the photoresist is very implementation specific depending upon the material of the photoresist, as will be appreciated by those in the art having the benefit of this disclosure. The strip may be either a wet strip or a dry strip, i.e., plasma, strip as are known in the art. Note that, in some alternative embodiments, the wafer may be processed through an ion implantation operation before the photoresist is removed.

The wafer then undergoes a final inspection, as set forth in the box 590. Final inspection is very similar to develop inspect except that there are no reworks. However, contaminated wafers may be recleaned and reinspected. Ultimately, final inspection certifies the quality of the outgoing wafers and checks the effectiveness of the develop inspection.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of performing a photolithography operation in a semiconductor fabrication process, the method comprising:
   aligning a first binary reticle including a first pattern with a portion of a layer of a wafer;
   exposing the portion of the wafer to light through the first binary reticle;
   aligning a second binary reticle with the portion of the layer of the wafer; the second reticle including a second pattern for transfer at a focal plane different from that of the first pattern and that is interdependent with but does not overlap the first pattern; and
   exposing the portion of the wafer to light through the second binary reticle.

2. The method of claim 1, further comprising:
   preparing the surface of the wafer before applying the photoresist;
   applying the photoresist; and
   softbaking the wafer after applying the photoresist and before aligning the reticle.

3. The method of 2, further comprising at least one of:
   developing the wafer;
   hard baking the developed wafer;
   inspecting the wafer for development defects;
   etching the wafer;
   removing the photoresist; and
   finally inspecting the wafer.

4. The method of claim 1, further comprising at least one of:
   developing the wafer;
   hard baking the developed wafer;
   inspecting the wafer for development defects;
   etching the wafer;
   removing the photoresist;
   processing the wafer through ion implantation; and
   finally inspecting the wafer.

5. The method of claim 1, wherein aligning at least one of the first and second reticles with the wafer includes moving the reticle until the alignment guide of the reticle and the alignment target in the wafer are aligned.

6. The method of claim 5, further comprising at least one of visually and optically aligning the alignment guide of the reticle and the alignment target in the wafer.

7. The method of claim 1, wherein exposing the wafer includes reducing the pattern.

8. The method of claim 1, further comprising stepping the wafer after exposing the portion through the first binary reticle and before aligning the second binary reticle.

9. The method of claim 1, further comprising stepping the wafer only after exposing the portion through the second binary reticle.

* * * * *